United States Patent
Kim et al.

(10) Patent No.: US 10,454,002 B2
(45) Date of Patent: Oct. 22, 2019

(54) LIGHT-EMITTING DEVICE PACKAGE AND LIGHTING DEVICE

(71) Applicant: LG INNOTEK CO., LTD., Seoul (KR)

(72) Inventors: Jae Wook Kim, Seoul (KR); Tae Ho Kim, Seoul (KR); Heung Ju Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/775,912

(22) PCT Filed: May 16, 2017

(86) PCT No.: PCT/KR2017/005060
§ 371 (c)(1),
(2) Date: May 14, 2018

(87) PCT Pub. No.: WO2017/200268
PCT Pub. Date: Nov. 23, 2017

(65) Prior Publication Data
US 2018/0323349 A1   Nov. 8, 2018

(30) Foreign Application Priority Data

May 16, 2016   (KR) .................. 10-2016-0059819

(51) Int. Cl.
*H01L 33/50* (2010.01)
*F21K 9/60* (2016.01)
(Continued)

(52) U.S. Cl.
CPC ........ *H01L 33/504* (2013.01); *C09K 11/0883* (2013.01); *C09K 11/7707* (2013.01);
(Continued)

(58) Field of Classification Search
CPC ....... H01L 33/48; H01L 33/50; H01L 33/504; H01L 33/52; H01L 33/60; H01L 33/62;
(Continued)

(56) References Cited

U.S. PATENT DOCUMENTS 9,072,148 B2 *   6/2015   Tanaka ................ H01L 25/0753
10,141,484 B2 *   11/2018   Asai ...................... H01L 33/504
(Continued)

FOREIGN PATENT DOCUMENTS

EP           2 905 818       8/2015
JP           2013-033971    2/2013
(Continued)

OTHER PUBLICATIONS

International Search Report (with English Translation) and Written Opinion dated Aug. 18, 2017 issued in Application No. PCT/KR2017/005060.
(Continued)

*Primary Examiner* — Dao H Nguyen
(74) *Attorney, Agent, or Firm* — KED & Associates LLP (57) ABSTRACT

An embodiment relates a light-emitting device package and a lighting device. A light-emitting device package according to an embodiment may include a package body 11, a light-emitting device 25 disposed on the package body 11, a molding member 41 disposed on the light-emitting device 25, and a phosphor 30 disposed in the molding member 41. An energy ratio of a first wavelength range of 415 nm to 455 nm of the light-emitting device may be 75% or less of energy of a sunlight source having the first wavelength range. An energy ratio of a second wavelength range of 465 nm to 495 nm of the light-emitting device may be 60% or more of energy of a sunlight source having the second wavelength range. Moreover, the energy ratio of the second wavelength range of 465 nm to 495 nm may be higher than the energy
(Continued)

ratio of a first wavelength range of 415 nm to 455 nm in the light-emitting device. The phosphor 30 may include a first phosphor 31 which is a green phosphor and a second phosphor 32 which is a red phosphor, thereby implementing a white light source with an emission wavelength of the light-emitting device 25 as an excitation wavelength.

18 Claims, 10 Drawing Sheets (51) Int. Cl.

| | | |
|---|---|---|
| *H01L 33/60* | (2010.01) | |
| *H01L 33/62* | (2010.01) | |
| *H01L 33/64* | (2010.01) | |
| *C09K 11/77* | (2006.01) | |
| *C09K 11/08* | (2006.01) | |

(52) U.S. Cl.
CPC ............... *F21K 9/60* (2016.08); *H01L 33/60* (2013.01); *H01L 33/62* (2013.01); *H01L 33/64* (2013.01)

(58) Field of Classification Search
CPC ... F21K 9/60; C09K 11/0883; C09K 11/7707; C09K 11/02
USPC ................ 257/79, 84, 98, 99, 100, E23.059, 257/E23.061, E23.072, E21.114, E21.411, 257/E31.038, E31.039, E31.097; 438/15, 438/29, 35, 65, 151; 313/498, 502, 503, 313/506; 315/152, 153, 294; 362/84, 362/293, 465, 613; 252/301.34, 301.36
See application file for complete search history.

(56) References Cited

U.S. PATENT DOCUMENTS

| | | |
|---|---|---|
| 2010/0277054 A1 | 11/2010 | Takashima et al. |
| 2011/0006334 A1 | 1/2011 | Ishii et al. |
| 2011/0157916 A1 | 6/2011 | Lee et al. |
| 2012/0062821 A1 | 3/2012 | Takeuchi et al. |
| 2014/0301062 A1* | 10/2014 | David ...................... F21V 9/30 362/84 |
| 2014/0354146 A1 | 12/2014 | Ishiwata et al. |
| 2015/0204493 A1* | 7/2015 | Omura .................... F21K 9/232 362/84 |
| 2015/0377429 A1 | 12/2015 | Yoo et al. |
| 2016/0308097 A1* | 10/2016 | Horie .................... H01L 33/504 |
| 2017/0047488 A1* | 2/2017 | Kaneko ................. H01L 33/504 |
| 2018/0274754 A1* | 9/2018 | Kusano .................... F21S 2/00 |
| 2018/0358515 A1* | 12/2018 | Kaneko ............... H01L 25/0753 |
| 2018/0358518 A1* | 12/2018 | Kim ....................... C09K 11/02 |

FOREIGN PATENT DOCUMENTS

| | | |
|---|---|---|
| JP | 2013-038447 | 2/2013 |
| KR | 10-2011-0076447 | 7/2011 |
| KR | 10-1319144 | 10/2013 |
| WO | WO 2014-054290 | 4/2014 |

OTHER PUBLICATIONS

Extended European Search Report dated Mar. 6, 2019 issued in Application 17799625.3.
Korean Office Action dated Mar. 13, 2019 issued in Application 10-2016-0059819 (full Korean text).

\* cited by examiner

LIGHT-EMITTING DEVICE PACKAGE AND LIGHTING DEVICE

CROSS-REFERENCE TO RELATED PATENT APPLICATIONS

This application is a U.S. National Stage Application under 35 U.S.C. § 371 of PCT Application No. PCT/KR2017/005060, filed May 16, 2017, which claims priority to Korean Patent Application No. 10-2016-0059819, filed May 16, 2016, whose entire disclosures are hereby incorporated by reference.

TECHNICAL FIELD

Embodiments relate to a light-emitting device package and a lighting device.

BACKGROUND ART

In light-emitting devices, a P-N junction diode having a characteristic of converting electrical energy into light energy may be manufactured by combining periodic table Group 3-5 elements or 2-6 elements, and various colors are realized by adjusting a combination ratio of compound semiconductors.

For example, nitride semiconductors are attracting much attention in the development field of light devices and high output electronic devices due to high thermal stability and energy having a wide bandgap. Particularly, blue light-emitting devices, green light-emitting devices, ultraviolet (UV) light-emitting devices, and red light-emitting devices using the nitride semiconductors have been commercialized and are being widely used.

Such light-emitting devices may realize various colors such as red, green, blue, and UV and may realize white light having good efficiency by using fluorescent materials or combining various lights emitted. Therefore, the light-emitting devices have low power consumption, a semi-permanent lifetime, a fast response time, safety, and environmental affinity in comparison with fluorescent lamps and incandescent lamps.

Examples of a method of realizing white light include a method using a single chip and a method using a multichip. For example, in a case where white light is realized by using the single chip, a method of obtaining white light by exciting at least one phosphor with light emitted from a blue light-emitting diode (LED) or an UV LED is being used. Alternatively, in the multichip, for example, there is a method of manufacturing a multichip by combining three kinds red (R), green (G), and blue (B) chips.

A retina of a human body includes a B cone cell, a G cone cell, and an R cone cell. A level of each of electrical signals varies based on a degree to which the three cone cells are excited by external light, and brains combine the electrical signals to determine a color.

The related art uses a blue LED having a center wavelength of 440 nm to 450 nm, for increasing an energy efficiency of a light source.

Figure 1A:
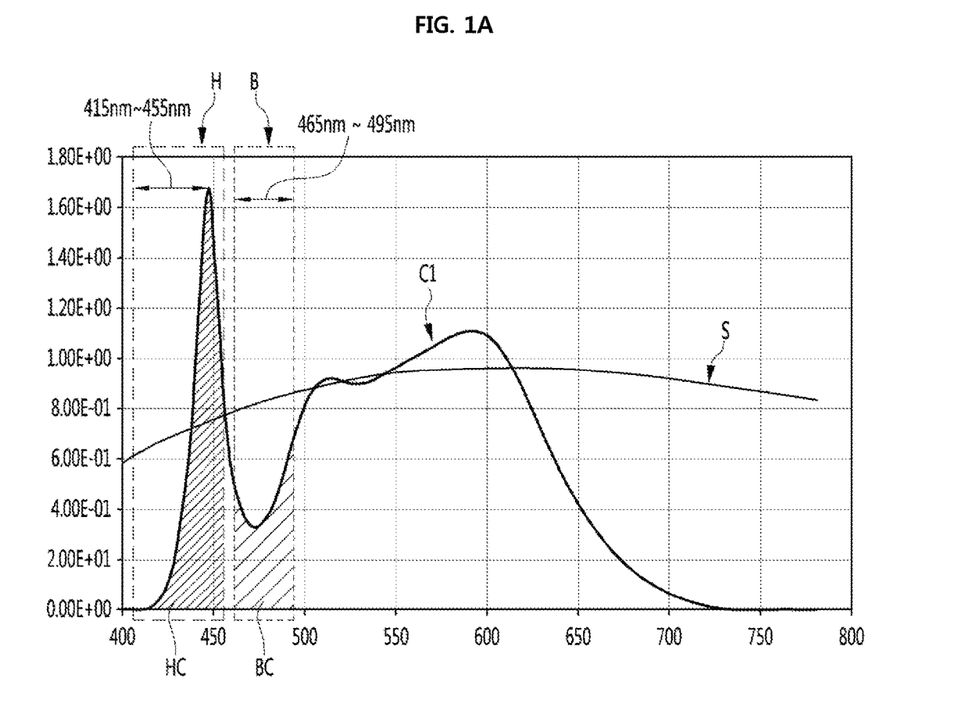
FIGS. 1A and 1B are exemplary diagrams of a wavelength spectrum of a first related art light-emitting device package.

For example, FIG. 1A is an exemplary diagram showing a wavelength spectrum C1 of a first related art light-emitting device package with respect to an emission wavelength S of sunlight. Referring to FIG. 1A, an energy ratio HC of a first wavelength range H of about 415 nm to 455 nm occupies an area which is larger than an energy ratio BC of a second wavelength range B of about 465 nm to 495 nm.

For example, in the related art, with respect to sunlight, the energy ratio HC of the first wavelength range (415 nm to 455 nm) area is about 98%, and the energy ratio BC of the second wavelength range (465 nm to 495 nm) area is merely about 54%.

Figure 1B:
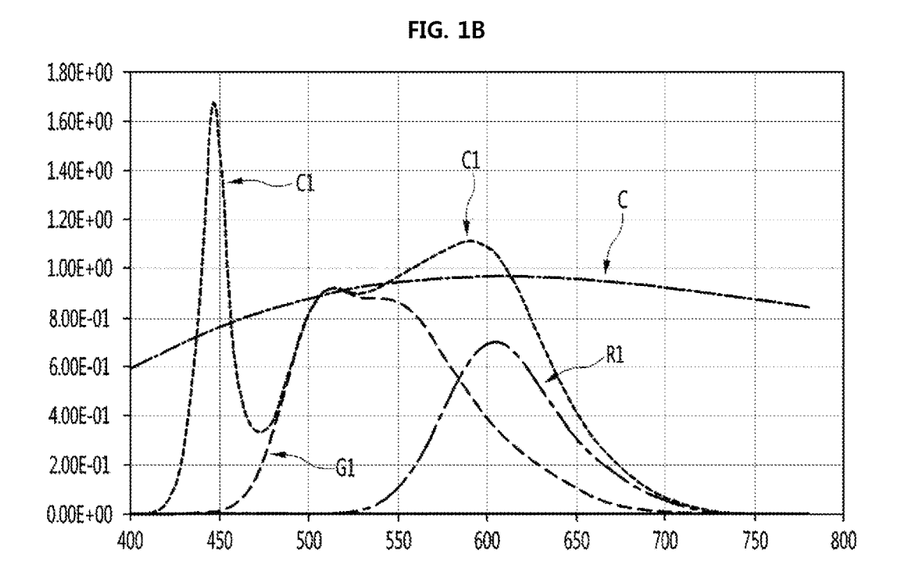

Moreover, FIG. 1B shows the wavelength spectrum C1 of the first related art light-emitting device package, a wavelength spectrum of a green phosphor G1 applied thereto, and a wavelength spectrum of a red phosphor R1 applied thereto.

According to recent research, in a case where a visual cell of a human body is exposed to light having the first wavelength range H of about 415 nm to 455 nm, an eye-hazardous effect is applied to eyes and is accumulated during one's lifetime. It is checked that the eye-hazardous effect causes age-related macular degeneration and damages a vision of persons. The age-related macular degeneration is a main cause of vision loss of old age, but occurs in young age recently. It has been known that if visual impairment starts due to the disease, it is unable to recover previous vision.

In order to decrease hazardousness within the first wavelength range H of about 415 nm to 455 nm, some researches have attempted to use a filter in front of an LED or wear glasses with a filter equipped therein. In the attempt, a wavelength range harmful to eyes of the first wavelength range H of about 415 nm to 455 nm, and in addition, another problem where a blue range necessary for manufacturing a white light source and the second wavelength range B of about 465 nm to 495 nm beneficial to control the one-week rhythm of a human body are removed occurs.

Figure 2:
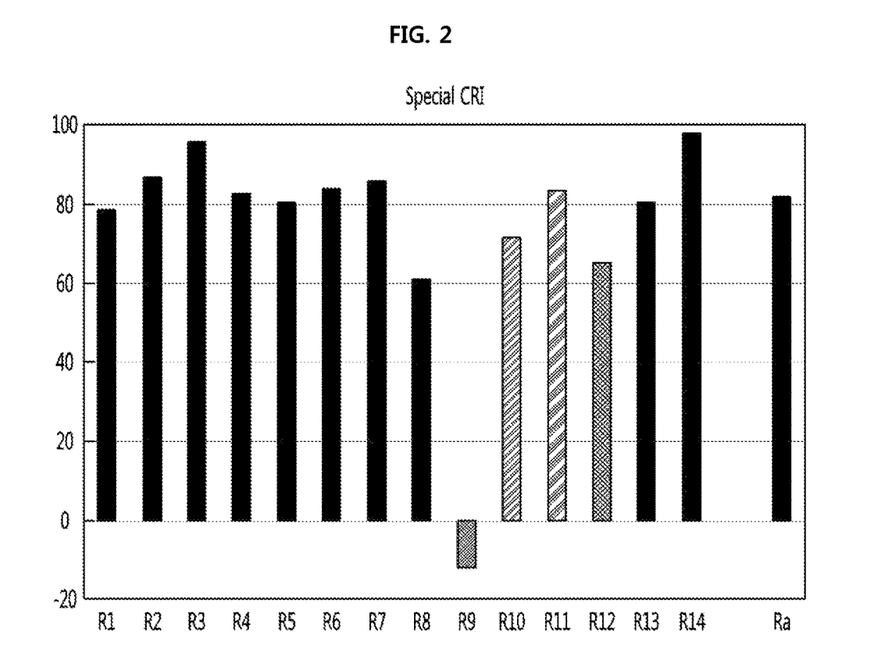
FIG. 2 shows CRI data of the first related art light-emitting device package.

FIG. 2 shows special CRI data of the first related art light-emitting device package. According to FIG. 2, a value of R9 (pure red) which is one of indicators indicating the quality of a light source is −11.9, and due to this, there is a problem where reflected light similar to sunlight is generated.

Figure 3:
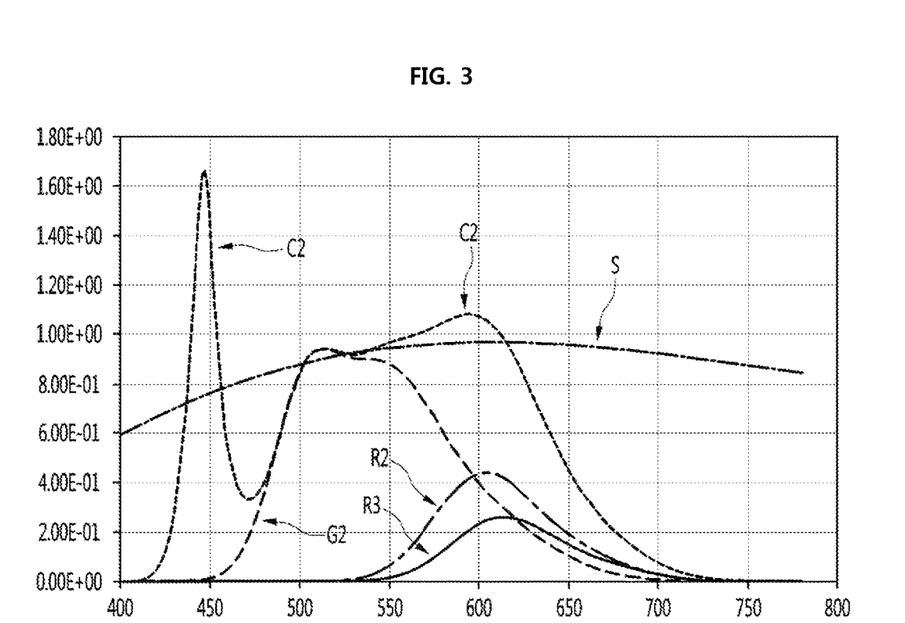
FIG. 3 is an exemplary diagram of a wavelength spectrum of a second related art light-emitting device package.

FIG. 3 shows a wavelength spectrum C2 of a second related art light-emitting device package, a wavelength spectrum of a green phosphor G2 applied thereto, a wavelength spectrum of a second red phosphor R2 applied thereto, and a wavelength spectrum of a third red phosphor R3 applied thereto. Generally, a phosphor where a photoluminescence (PL) wavelength is a long wavelength has light efficiency which is lower than that of a phosphor having a short wavelength, and thus, is reduced in luminous flux.

The second related art cannot satisfy requirement "R9>0" of business community by using only the second red phosphor R2 (a peak wavelength of 610 nm) having a short wavelength. Therefore, by using the third red phosphor R3 (a peak wavelength of 625 nm) having a long wavelength and low energy efficiency together, it has been attempted to improve an R9 indicator despite the luminous flux being lost.

Therefore, the related art has a technical limitation which cannot satisfy both a technical characteristic for enhancing the luminous flux and a technical characteristic for improving (for example, R9>0) a special CRI index.

DISCLOSURE

Technical Problem

Embodiments provide a light-emitting device package and a lighting device, which can minimize a wavelength range harmful to a human body and maximize a wavelength range beneficial to a human body.

Moreover, embodiments provide a light-emitting device package and a lighting device, which can satisfy both a technical characteristic for enhancing the luminous flux and a technical characteristic for improving (for example, R9>0) a special CRI index.

Technical Solution

A light-emitting device package according to an embodiment may include a package body 11, a light-emitting device 25 disposed on the package body 11, a molding member 41 disposed on the light-emitting device 25, and a phosphor 30 disposed in the molding member 41.

An energy ratio of a first wavelength range of 415 nm to 455 nm of the light-emitting device may be 75% or less of energy of a sunlight source having the first wavelength range.

An energy ratio of a second wavelength range of 465 nm to 495 nm of the light-emitting device may be 60% or more of energy of a sunlight source having the second wavelength range.

Moreover, the energy ratio of the second wavelength range of 465 nm to 495 nm may be higher than the energy ratio of a first wavelength range of 415 nm to 455 nm in the light-emitting device.

The phosphor 30 may include a first phosphor 31 which is a green phosphor and a second phosphor 32 which is a red phosphor, thereby implementing a white light source with an emission wavelength of the light-emitting device 25 as an excitation wavelength.

For example, the phosphor 30 may include a first phosphor 31 having an emission center wavelength of 515 nm to 570 nm and a second phosphor 33 having an emission center wavelength of 580 nm to 670 nm, thereby implementing a white light source with an emission wavelength of the light-emitting device 25 as an excitation wavelength.

Moreover, the phosphor 30 may include a first phosphor 31 having a center wavelength of 515 nm to 570 nm, a second phosphor 32 having a center wavelength of 580 nm to 670 nm, and a third phosphor 33 having a center wavelength of 490 nm to 505 nm, thereby implementing a white light source with an emission wavelength of the light-emitting device as an excitation wavelength.

A lighting device according to an embodiment may include a light-emitting unit including the light-emitting device package.

Advantageous Effects

Embodiments may provide a light-emitting device package and a lighting device, which can minimize a wavelength range harmful to a human body and maximize a wavelength range beneficial to a human body.

Moreover, embodiments may provide a light-emitting device package and a lighting device, which can satisfy both a technical characteristic for enhancing the luminous flux and a technical characteristic for improving (for example, R9>0) a special CRI index.

MODE FOR INVENTION

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Also, the reference about 'on' and 'under' each layer will be made on the basis of drawings, but embodiments are not limited thereto.

(Embodiment)

Figure 4:
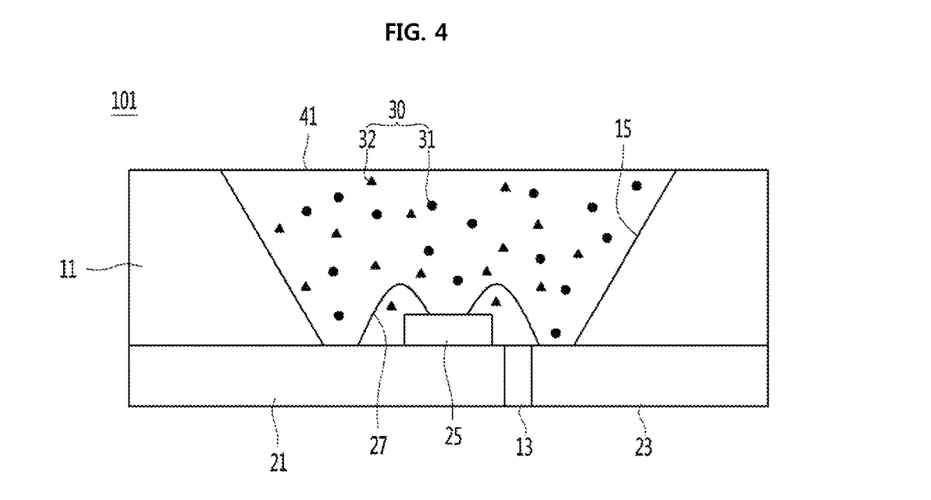
FIG. 4 is a cross-sectional view of a light-emitting device package according to a first embodiment.

FIG. 4 is a cross-sectional view of a light-emitting device package according to a first embodiment.

Referring to FIG. 4, a light-emitting device package 101 of an embodiment may include one or more of a body 11, a plurality of lead frames 21 and 23, a light-emitting device 25, a phosphor 30, and a molding member 41.

For example, the light-emitting device package 101 may include a body 11, a plurality of lead frames 21 and 23 disposed on the body 11, a light-emitting device 25 electrically connected to the plurality of lead frames 21 and 23, and a molding member 41 which is disposed on the light-emitting device 25 and includes a phosphor 30.

The body 11 may be formed of a material (for example, a material having a reflectivity of 70% or more) where a reflectivity is higher than a transmittance with respect to a wavelength emitted from the light-emitting device 25. In a case where a reflectivity is 70% or more, the body 11 may be defined as a non-transmissive material.

The body 11 may be formed of a resin-based insulating material, for example, a resin material such as polyphthalamide (PPA). Alternatively, in the body 11, metal oxide may be added to a resin material such as epoxy or silicon. The metal oxide may include at least one of $TiO_2$, $SiO_2$, or $Al_2O_3$.

The body 11 may include a silicon-based material, an epoxy-based material, or a plastic material, and may be formed of thermocurable resin, a high heat-resistant material, a high light-resistant material.

Moreover, acid anhydride, an antioxidant, a release agent, a light-reflecting agent, an inorganic charging agent, a hardening catalyst, a light stabilizer, a lubricating agent, and titanium dioxide may be selectively added to the body 11.

Moreover, the body 11 may be formed of at least one material selected from the group consisting of epoxy resin, epoxy-modified resin, silicon resin, silicon-modified resin, acrylic resin, and urethane resin. For example, in the body 11, epoxy resin including triglycidyl isocyanurate and hydride bisphenol A diglycidyl ether and acid anhydride including hexa hydro phthalic anhydride, 3-methylhexahydrophthalic anhydride, and 4-methylhexahydrophthalic anhydride may be added to epoxy resin as a hardening accelerant, ethylene glycol, a titanium oxide pigment, and a glass fiber may be added to 1,8-Diazabicyclo(5,4,0)undecene-7 (DBU) as a cocatalyst, and a hardening reaction may be partially performed through heating, whereby a B-stage solid epoxy resin composition may be used. However, the present invention is not limited thereto.

In an embodiment, a light-blocking material or a dispersing agent may be mixed in the body 11, thereby decreasing the amount of transmitted light. Also, in order for the body 11 to have a certain function, at least one material selected from the group consisting of a dispersing agent, a phosphorescent material, a reflective material, a light-blocking material, a light stabilizer, and a lubricating agent may be appropriately mixed with thermocurable resin.

The body 11 may include a cavity 15 which is recessed by a certain depth from a top of the body 11 and includes an opened upper portion. The cavity 15 may be provided in a shape such as a concave cup structure, an open structure, or a recess structure, but is not limited thereto.

The cavity 15 may have a width which is progressively widened in an upward direction, thereby improving light extraction efficiency.

The plurality of lead frames (for example, first and second lead frames 21 and 23) may be disposed on the body 11. The first and second lead frames 21 and 23 may be disposed on a bottom of the cavity 15, and outer portions of the first and second lead frames 21 and 23 may be exposed at least one side surface of the body 11 through the body 11. A lower portion of the first lead frame 21 and a lower portion of the second lead frame 23 may be exposed at a lower portion of the body 11, mounted on a circuit board, and supplied with power.

As example of the first and second lead frames 21 and 23, at least one or all of the first and second lead frames 21 and 23 may include a groove or a hole which is provided in a structure having a concave cup shape or a bent structure and is recessed for coupling with the body 11, but is not limited thereto. The light-emitting device 25 may be disposed in the concave cup shape, but is not limited thereto.

The first lead frame 21 and a lower portion of the second lead frame 23 may include a metal material, for example, at least one of titanium (Ti), copper (Cu), nickel (Ni), gold (Au), chromium (Cr), tantalum (Ta), platinum (Pt), tin (Sn), silver (Ag), and phosphorus (P), and may be formed of a single layer or a multilayer.

The light-emitting device 25 may be disposed on the first lead frame 21, and the light-emitting device 25 may be attached on the first lead frame 21 by an adhesive member, but is not limited thereto. The light-emitting device 25 may be connected to at least one of the first and second lead frames 21 and 23 by a connection member 27, but is not limited thereto. The connection member 27 may include wire including a conductive material, for example, a metal material.

The light-emitting device 25 may include at least one of a Group II-VI compound and a Group III-V compound. The light-emitting device 25 may be formed of, for example, a compound selected from the group consisting of GaN, AlGaN, InGaN, AlInGaN, GaP, AlN, GaAs, AlGaAs, InP, and a compound thereof.

The molding member 41 may be disposed on the cavity 15. The molding member 41 may include the phosphor 30 according to an embodiment. The phosphor 30 may include phosphorescent materials which emit lights having different peak wavelengths.

For example, the phosphor 30 may include a first phosphor 31 and a second phosphor 33, which emit lights having different peak wavelengths. The first phosphor 31 may include one kind of phosphor or two or more kinds of phosphors, and for example, may include a green phosphor which emits light (for example, green light) having a first peak wavelength with a peak wavelength, emitted from the light-emitting device 25, as an excitation wavelength. The second phosphor 33 may emit light having a second peak wavelength (for example, a red peak wavelength) with the peak wavelength, emitted from the light-emitting device 25, as the excitation wavelength.

As described above, a first technical problem of an embodiment is to provide a light-emitting device package and a lighting device, which can minimize a wavelength range harmful to a human body and maximize a wavelength range beneficial to a human body, and moreover, a second technical problem of an embodiment is to provide a light-emitting device package and a lighting device, which can satisfy both a technical characteristic for enhancing the luminous flux and a technical characteristic for improving (for example, R9>0) a special CRI index.

An embodiment has effectively solved the first technical problem and the second technical problem as follows, and such a technical solution and technical effect will be described in detail.

Figure 5A:
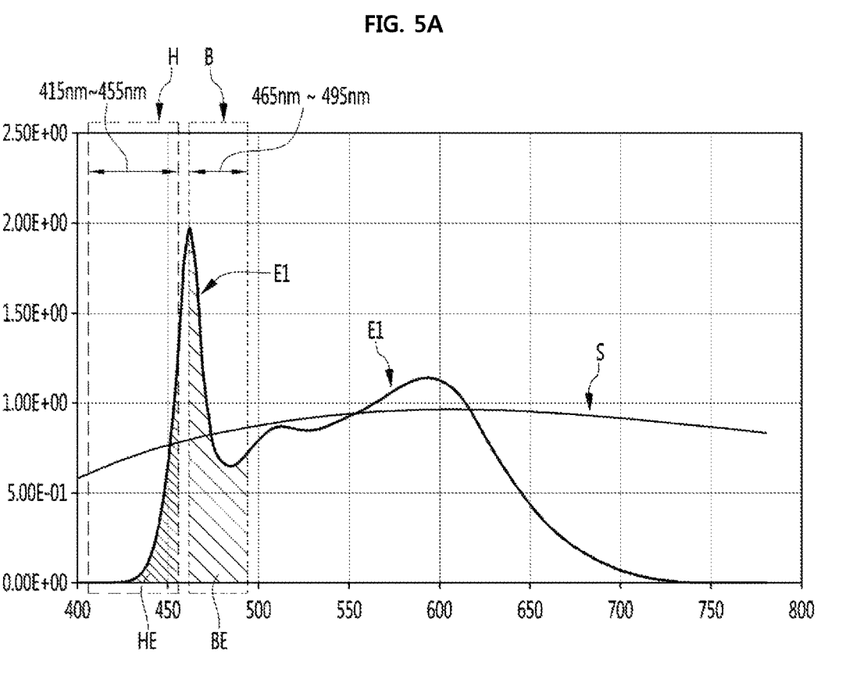
FIGS. 5A and 5B are exemplary diagrams of a wavelength spectrum of the light-emitting device package according to the first embodiment.

FIG. 5A is an exemplary diagram of a wavelength spectrum E1 of the light-emitting device package according to the first embodiment and a sunlight wavelength spectrum S.

Figure 5B:
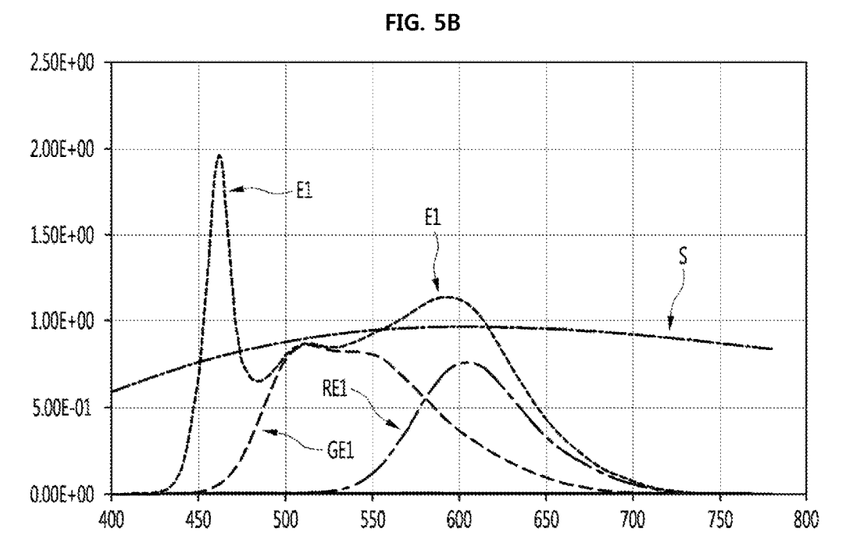

FIG. 5B shows the wavelength spectrum E1 of the light-emitting device package according to the first embodiment, a wavelength spectrum GE1 of a first phosphor used therein, a wavelength spectrum RE1 of a second phosphor used therein.

The first embodiment may use the first phosphor 31 having a PL peak wavelength of 535 nm in a green wavelength range and the second phosphor 32 having a PL peak wavelength of 610 nm in a red wavelength range and may be a wavelength spectrum for implementing a white light source where color coordinates are (0.3535, 0.3721) and CCT is 4780 K, but is not limited thereto.

The related art increases an energy ratio of a first wavelength range (415 nm to 455 nm) area H harmful to eyes so as to increase energy efficiency and decreases an energy ratio of a second wavelength range (465 nm to 495 nm) B beneficial to a human body.

For example, referring to FIG. 1A, in the related art, an energy HC ratio of a first wavelength range (415 nm to 455 nm) area is about 98%, and an energy BC ratio of a second wavelength range (465 nm to 495 nm) area is only about 54%, with respect to sunlight.

On the other hand, in order to solve the technical problems, an embodiment may perform control so that an energy BE ratio of the second wavelength range of 465 nm to 495 nm is higher than an energy HE ratio of the first wavelength range of 415 nm to 455 nm.

For example, in an embodiment, an emission wavelength of the light-emitting device 25 may be controlled so that the energy HE ratio of the first wavelength range of 415 nm to 455 nm is 75% or less (for example, 60% or less) of energy of a sunlight source having the first wavelength range, and the emission wavelength of the light-emitting device 25 may be controlled so that the energy BE ratio of the second wavelength range of 465 nm to 495 nm is 60% or more (for example, 80% or more or 90% or more) of energy of a sunlight source having the second wavelength range. For example, the energy ratio of the second wavelength range of 465 nm to 495 nm of the light-emitting device 25 may be equal to or higher than 100% of the energy of the sunlight source having the second wavelength range.

For example, the energy HE ratio of the first wavelength range of 415 nm to 455 nm of the light-emitting device 25 may decrease by about 32% of the sunlight, but the energy BE ratio of the second wavelength range of 465 nm to 495 nm may be controlled to about 104% of the sunlight.

Furthermore, in an embodiment, the energy BE ratio of the second wavelength range of 465 nm to 495 nm may be enhanced to about 148% of the sunlight.

According to an embodiment, light energy having the second wavelength range (465 nm to 495 nm) B increases in comparison with the sunlight, and light within the second wavelength range B region is an area necessary for several metabolic activities, and for example, is necessary for dilatation or contraction of pupils for protecting eyes and circadian entrainment of a human body, helps sleep regulation through melatonin control, and has an effect of reducing melancholy and an effect of reinforcing alertness and concentration, thereby obtaining beneficial effects such as enhancement of job performance, enhancement of learning ability, and reinforcement of memory.

Therefore, according to an embodiment, provided may be a light-emitting device package and a lighting device, which can minimize a wavelength range (415 nm to 455 nm) harmful to a human body and maximize a wavelength range (465 nm to 495 nm) beneficial to a human body.

Figure 6:
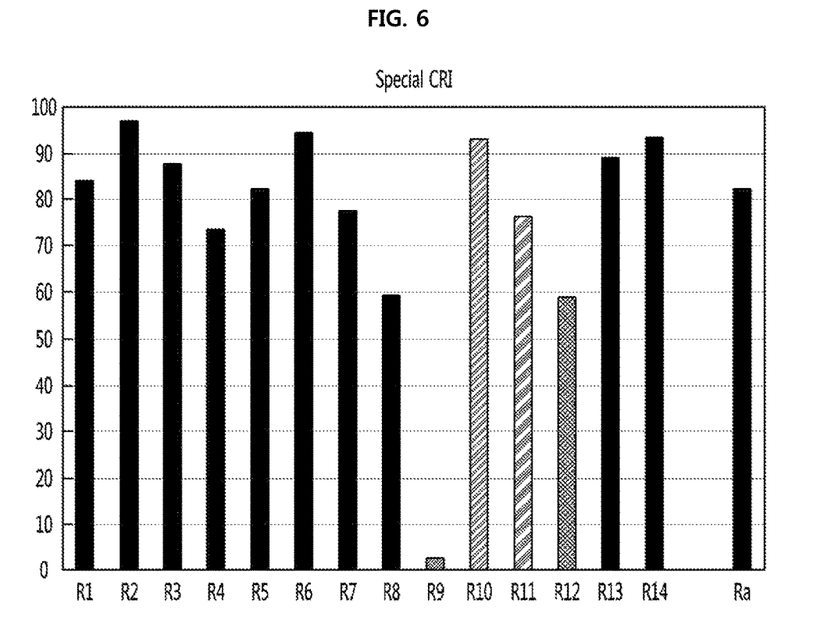
FIG. 6 shows CRI data of the light-emitting device package according to the first embodiment.

FIG. 6 shows special CRI data of the light-emitting device package according to the first embodiment.

As described above, the related art cannot satisfy requirement "R9>0" of business community by using only the second red phosphor R2 (a peak wavelength of 610 nm) having a relatively short wavelength, and therefore, by using the third red phosphor R3 (a peak wavelength of 625 nm) having a long wavelength and low energy efficiency together, it has been attempted to improve an R9 indicator despite the luminous flux being lost.

Therefore, the related art has a technical limitation which cannot satisfy both a technical characteristic for enhancing the luminous flux and a technical characteristic for improving (for example, R9>0) a special CRI index.

In the light-emitting device package according to an embodiment, despite using the second phosphor 32 which is a short-wavelength red phosphor having high efficiency, an effect where an R9 value considerably increases from conventional −11.9 to 2.7 is obtained.

Therefore, an embodiment may provide a light-emitting device package and a lighting device, which can overcome a technical limitation by satisfying both a technical characteristic for enhancing the luminous flux and a technical characteristic for improving (for example, R9>0) the special CRI index.

Figure 7A:
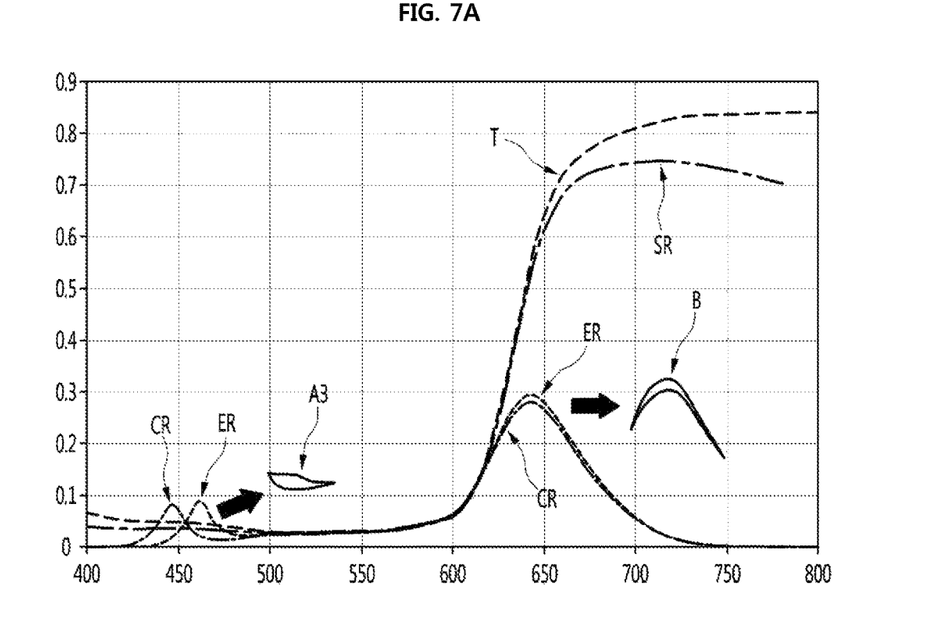
FIGS. 7A to 7C show pieces of data obtained by comparing the wavelength spectrum of the light-emitting device package according to the first embodiment with the wavelength spectrum of the first related art light-emitting device package.
Figure 7B:
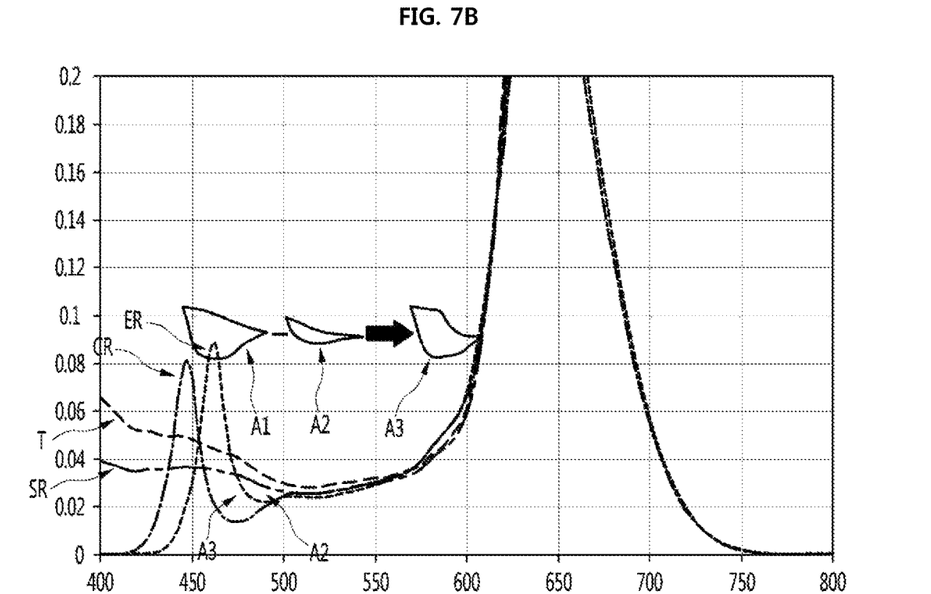
Figure 7C:
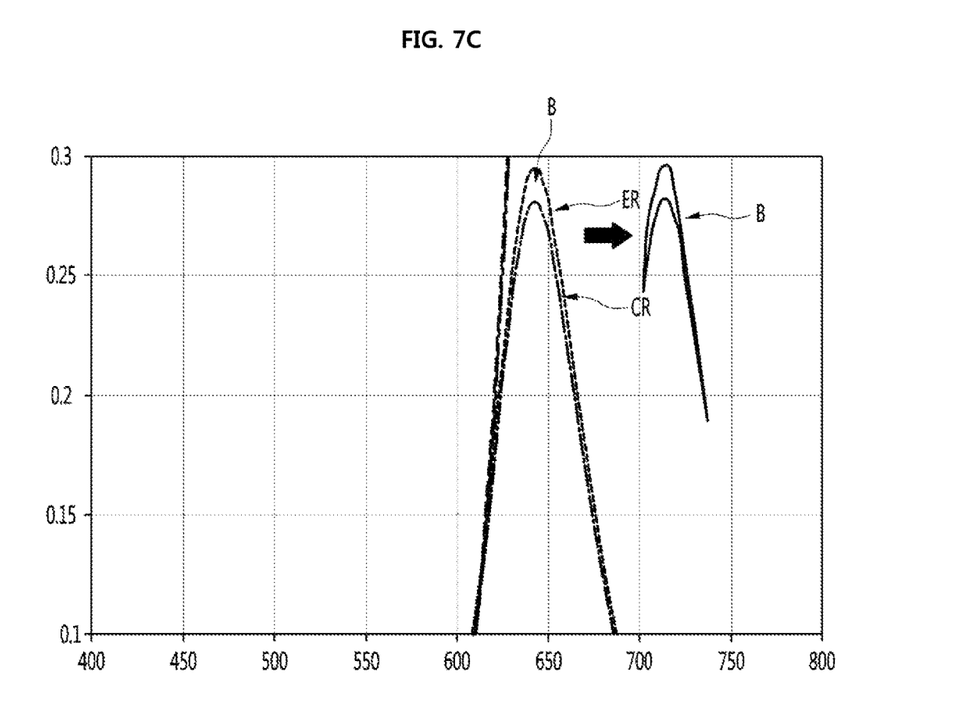

FIGS. 7A to 7C show a reflectivity curve of the light-emitting device package according to the first embodiment with a reflectivity curve of the first related art light-emitting device package. Hereinafter, a technical solution principle which overcomes a technical limitation by satisfying both a technical characteristic for enhancing the luminous flux and a technical characteristic for improving (for example, R9>0) the special CRI index in the light-emitting device package according to an embodiment will be described in detail with reference to FIGS. 7A to 7C.

Referring to FIG. 7A, a TCS09 reflectivity T is one of standard CRI samples for calculation CRI and is strong red appearing under daylight, SR is a sunlight reflectivity curve, ER is a reflectivity curve of the light-emitting device package according to an embodiment, and CR is a reflectivity curve of the related art.

In an embodiment, reflected light similar to Ref sunlight reflection SR should be emitted for increasing the R9 value. This will be compared with the related art.

First, FIG. 7A shows a result obtained by comparing a distribution of reflection CR of the related art and a distribution of reflection ER of an embodiment with respect to the Ref sunlight reflection SR, and an embodiment shows that reflected light is similar to the sunlight by an A3 area in the second wavelength range (465 nm to 495 nm) and is similar to the sunlight by a B area in a red phosphor emission wavelength range in comparison with the first related art. Due to the increased reflected light area similar to the sunlight, an effect where the R9 value considerably increases from conventional −11.9 to 2.7 is obtained.

In detail, referring to FIG. 7B, reflected light is improved to a reflected light area A2 of an embodiment in the second wavelength range (465 nm to 495 nm) in comparison with a reflected light area A1 of the first related art, and thus, the reflected light becomes more similar to the sunlight by the A3 area.

Moreover, referring to FIG. 7C, reflected light is improved to a reflected light ER of an embodiment in the red phosphor emission wavelength range in comparison with reflected light CR of the first related art, and thus, the reflected light becomes more similar to the sunlight by the B area.

Therefore, since an embodiment does not use a second red phosphor having a long wavelength unlike the related arts, the luminous flux is not reduced. Accordingly, an embodiment may provide a light-emitting device package and a lighting device, which can overcome a technical limitation by satisfying both a technical characteristic for enhancing the luminous flux and a technical characteristic for improving (for example, R9>0) the special CRI index.

Moreover, according to an embodiment, provided may be a light-emitting device package and a lighting device, which can implement lighting middle CRI (Ra>80) or high CRI (Ra>90).

Referring again to FIGS. 4 and 5B, an embodiment may include the first phosphor 31 which is a green phosphor and the second phosphor 32 which is a red phosphor, thereby implementing a white light source with an emission wavelength of the light-emitting device 25 as an excitation wavelength.

In an embodiment, a phosphor composition of the first phosphor 31 which is the green phosphor may be formed higher in ratio than and the second phosphor 32 which is the red phosphor. For example, a relative ratio of the first phosphor 31 which is a green phosphor and the second phosphor 32 which is a red phosphor may be 85 wt % to 95 wt % or 5 wt % to 15 wt %, but is not limited thereto.

Moreover, in an embodiment, a ratio of the phosphor to the molding member 41 may be 20 wt % to 40 wt %, but is not limited thereto.

For example, the first phosphor 31 may have an emission center wavelength of 515 nm to 570 nm. For example, the first phosphor 31 may include one kind of material or two or more kinds of materials selected from among $(Y, Gd, Lu, Tb)_{3-x}(Al, Ga)_5O_{12}:Ce_x$, $(Mg, Ca, Sr, Ba)_2SiO_4:Eu$, $(Ca, Sr)_3SiO_5:Eu$, $(La, Ca)_{3-x}Si_6N_{11}:Ce_x$, $\alpha$-SiAlON:Eu, $\beta$-SiAlON:Eu, $Ba_3Si_6O_{12}N_2:Eu$, $Ca_3(Sc, Mg)_2Si_3O_{12}:Ce$, CaSc$_2$O$_4$:Eu, BaAl$_8$O$_{13}$:Eu, (Ca, Sr, Ba)Al$_2$O$_4$:Eu, (Sr, Ca, Ba)(Al, Ga, In)$_2$S$_4$:Eu, (Ca, Sr)$_8$(Mg, Zn)(SiO$_4$)$_4$C$_{12}$:Eu/Mn, (Ca, Sr, Ba)$_3$MgSi$_2$O$_8$:Eu/Mn, (Ca, Sr, Ba)$_2$(Mg, Zn)Si$_2$O$_7$:Eu, Zn$_2$SiO$_4$:Mn, (Y, Gd)BO$_3$:Tb, ZnS:Cu,Cl/Al, ZnS:Ag, Cl/Al, (Sr, Ca)$_2$Si$_5$N$_8$:Eu, (Li, Na, K)$_3$ZrF$_7$:Mn, (Li, Na, K)$_2$(Ti, Zr)F$_6$:Mn, (Ca, Sr, Ba)(Ti, Zr)F$_6$:Mn, Ba$_{0.65}$Zr$_{0.35}$F$_{2.7}$:Mn, (Sr, Ca)S:Eu, (Y, Gd)BO$_3$:Eu, (Y, GOV,P)O$_4$:Eu, Y$_2$O$_3$:Eu, (Sr, Ca, Ba, Mg)$_5$(PO$_4$)$_3$Cl:Eu, (Ca, Sr, Ba)MgAl$_{10}$O$_{17}$:Eu, (Ca, Sr, Ba)Si$_2$O$_2$N$_2$:Eu, and 3.5MgO.0.5MgF$_2$.GeO$_2$:Mn.

The first phosphor 31 may include a quantum dot, and the quantum dot may include a Group II-VI compound and a Group III-V compound and may emit green light. The quantum dot may be, for example, materials such as ZnS, ZnSe, ZnTe, CdS, CdSe, CdTe, GaN, GaP, GaAs, GaSb, InP, InAs, In,Sb, AlS, AlP, AlAs, PbS, PbSe, Ge, Si, CuInS$_2$, and CuInSe$_2$ and a combination thereof.

The second phosphor 33 may emit light having the second peak wavelength (for example, the red peak wavelength) with light, emitted from the light-emitting device 25, as the excitation wavelength. The second phosphor 33 may have an emission center wavelength of 580 nm to 670 nm.

The second phosphor 33 may include a compound-based phosphor (for example, (Ca,Sr)S:Eu$^{2+}$) or a nitride-based phosphor (for example, Ca$_{1-x}$AlSiN$_3$:Eu$_{2+x}$). For example, the second phosphor 32 may include a composition of (Sr, Ca)$_{1-x}$AlSiN$_3$:Eu$^{2+}{}_x$ (0.01≤x≤0.3), but is not limited thereto.

An activator of the second phosphor 32 may be a quadrupole transition metal ion such as Mn$^{4+}$ or a metal ion selected from among various rare-earth ions or transition metal ions, and for example, may be a trivalent rare-earth metal ion such as Eu$^{2+}$, Ce$^{3+}$, Pr$^{3+}$, Nd$^{3+}$, Sm$^{3+}$, Eu$^{3+}$, Gd$^{3+}$, Tb$^{3+}$, Dy$^{3+}$, Ho$^{3+}$, Er$^{3+}$, Tm$^{3+}$, or Yb$^{3+}$, a divalent rare-earth metal ion such as Sm$^{2+}$, Eu$^{2+}$, or Yb$^{2+}$, a divalent transition metal ion such as Mn$^{2+}$, a trivalent transition metal ion such as Cr$^{3+}$ or Fe$^{3+}$, or the like. For example, the second phosphor 32 may be K$_2$Si$_{1-x}$F$_6$:Mn$_{4+x}$, but is not limited thereto.

Figure 8:
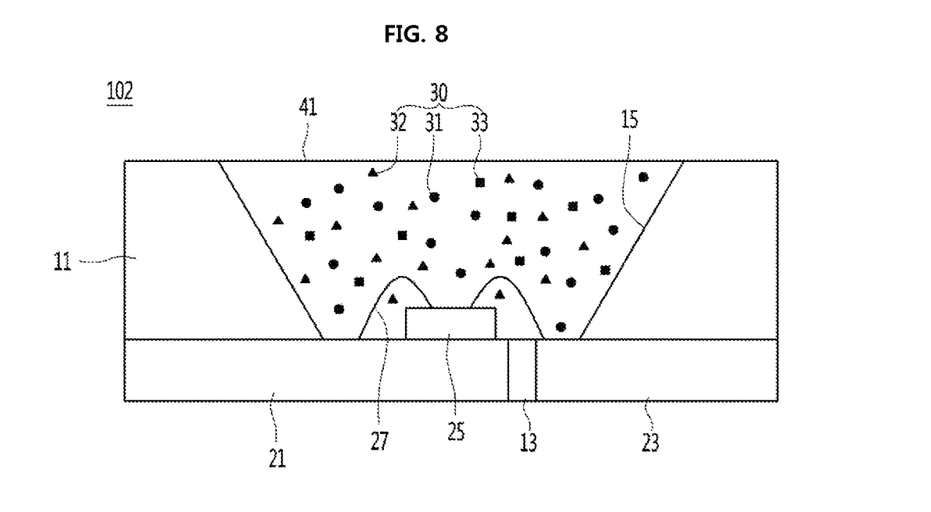
FIG. 8 is a cross-sectional view of a light-emitting device package according to a second embodiment.

FIG. 8 is a cross-sectional view of a light-emitting device package 102 according to a second embodiment.

The second embodiment may use the technical features of the first embodiment.

For example, the light-emitting device package 102 according to the second embodiment may include a package body 11, a light-emitting device 25 disposed on the package body 11, a molding member 41 disposed on the light-emitting device 25, and a phosphor 30 disposed in the molding member 41.

Hereinafter, a main feature of the second embodiment will be mainly described.

In the second embodiment, the phosphor 30 may include a first phosphor 31 having a center wavelength of 515 nm to 570 nm, a second phosphor 32 having a center wavelength of 580 nm to 670 nm, and a third phosphor 33 having a center wavelength of 490 nm to 505 nm, thereby implementing a white light source with an emission wavelength of the light-emitting device 25 as an excitation wavelength.

In an embodiment, the third phosphor 33 having a center wavelength of 490 nm to 505 nm may be a cyan phosphor, and for example, a composition of the third phosphor 33 may be one or more of (Ba, Mg)$_{3-a}$Si$_{6-b}$O$_{3.5-c}$N$_{8.5-d}$(Li, Cl, F, P)$_{1-e}$:Eu$^{2+}{}_a$, (Ba, Mg, Ca, Sr)$_{3-a}$Si$_6$O$_3$.N$_8$:E$^{2+}{}_a$, (Ba, Mg, Ca, Sr)$_{1-a}$Si$_2$O$_2$N$_2$:Eu$^{2+}{}_a$, but is not limited thereto.

In an embodiment, a phosphor composition of the first phosphor 31 which is a green phosphor may be formed higher in ratio than and the second phosphor 32 which is a red phosphor. Also, in an embodiment, a phosphor composition of the third phosphor 33 which is the cyan phosphor may be formed lower in ratio than and the second phosphor 32 which is the red phosphor.

For example, a relative ratio of the first phosphor 31 which is the green phosphor, the second phosphor 32 which is the red phosphor, and the third phosphor 33 which is the cyan phosphor may be 70 wt % to 80 wt %, 10 wt % to 20 wt %, or 5 wt % to 15 wt %, but is not limited thereto.

Figure 9A:
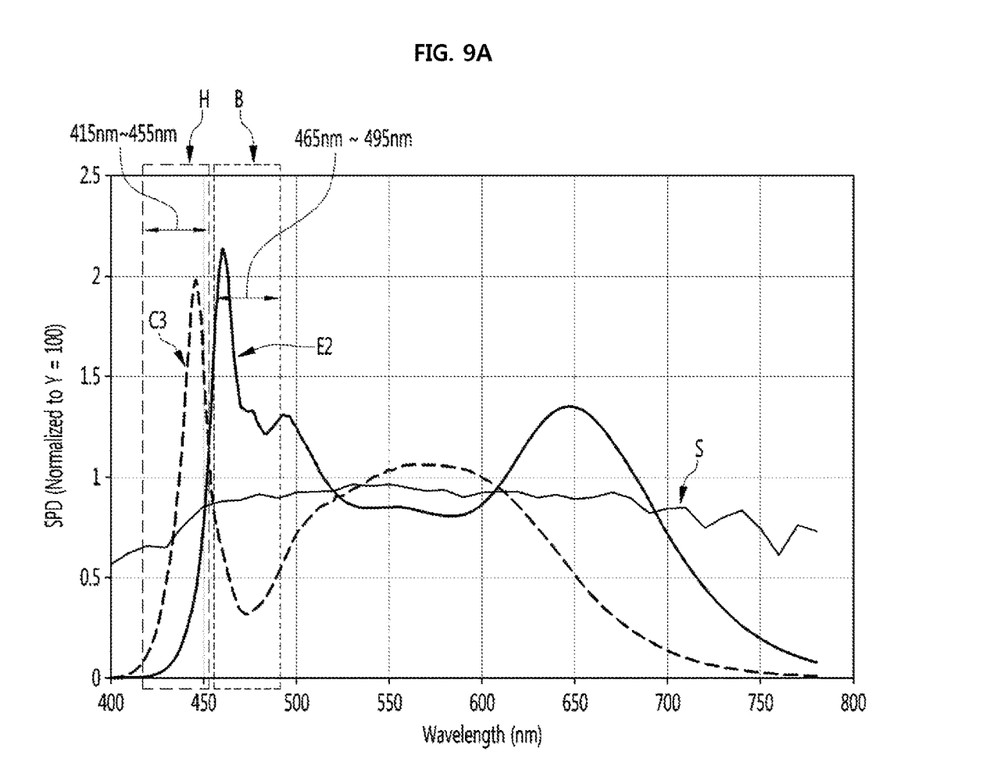
FIGS. 9A and 9B are exemplary diagrams showing a wavelength spectrum of the light-emitting device package according to the second embodiment and a wavelength spectrum of a third related art light-emitting device package.

FIG. 9A is an exemplary diagram showing a wavelength spectrum E2 of the light-emitting device package according to the second embodiment and a wavelength spectrum C3 of a third related art light-emitting device package. In the light-emitting device package according to the second embodiment, CCT may be 5164K, and (Cx, Cy) may be (0.3403, 0.3426). However, the present embodiment is not limited thereto.

According to the second embodiment, provided may be a light-emitting device package and a lighting device, which can minimize a wavelength range (415 nm to 455 nm) H harmful to a human body and maximize a wavelength range (465 nm to 495 nm) B beneficial to a human body.

Moreover, the second embodiment may provide a light-emitting device package and a lighting device, which can overcome a technical limitation by satisfying both a technical characteristic for enhancing the luminous flux and a technical characteristic for improving (for example, R9>0) the special CRI index.

Furthermore, as described below, the second embodiment has an advantage technical effect which is more enhanced than the first embodiment.

Figure 9B:
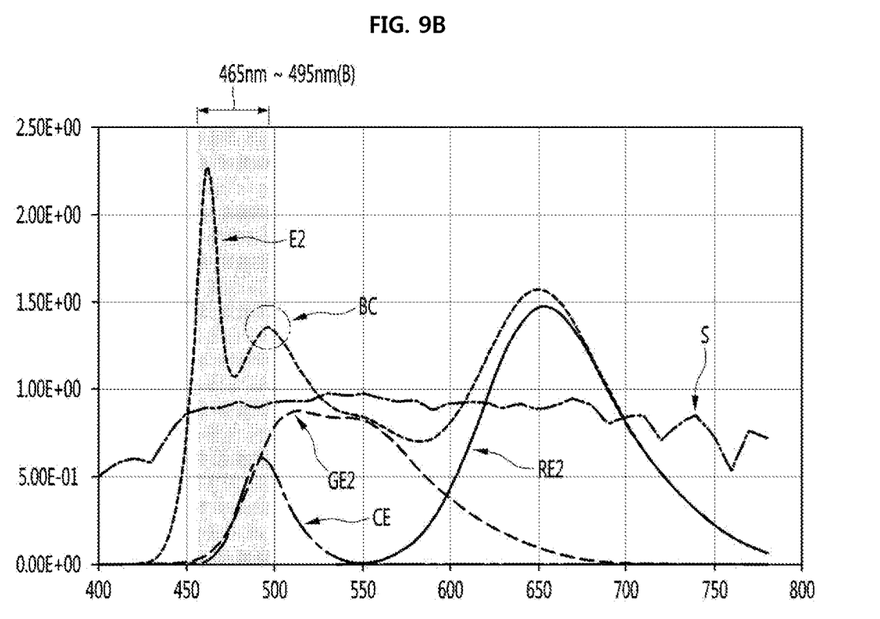

FIG. 9B is an exemplary diagram showing the wavelength spectrum E2 of the light-emitting device package according to the second embodiment, a wavelength spectrum GE2 of a first phosphor used therein, a wavelength spectrum RE1 of a second phosphor used therein, and a wavelength spectrum CE of a third phosphor used therein.

According to the second embodiment, by using the third phosphor 33 which is the cyan phosphor, a technical effect where an energy ratio of the second wavelength range (465 nm to 495 nm) beneficial to a human body increases more (BC) is obtained.

For example, in the second embodiment, an energy BE ratio of the second wavelength range of 465 nm to 495 nm may be enhanced to about 180% of the sunlight.

The light-emitting device according to an embodiment may be applied to lighting units, display devices, backlight units, indication devices, lamps, street lamps, lighting devices for vehicles, display devices for vehicles, smart watches, etc., but is not limited thereto.

Figure 10:
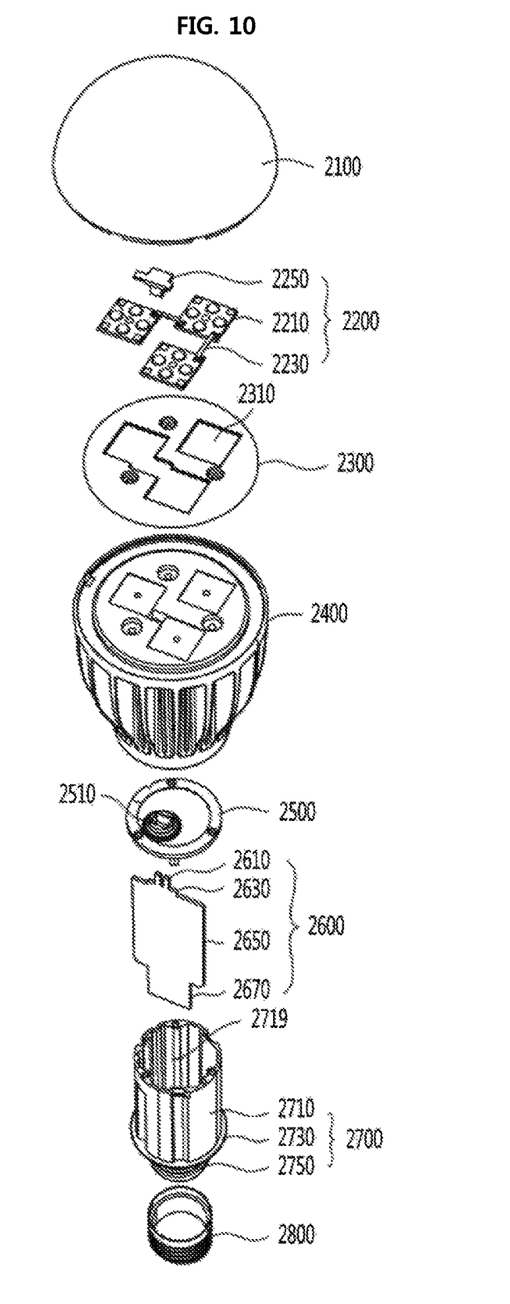
FIG. 10 is an exploded perspective view of a lighting device according to an embodiment.

FIG. 10 is an exploded perspective view of a lighting device according to an embodiment.

The lighting device according to an embodiment may include a cover 2100, a light source module 2200, a heat dissipation member 2400, a power supply unit 2600, an internal case 2700, and a socket 2800. Also, the lighting device according to an embodiment may further include one or more of a member 2300 and a holder 2500. The light source module 2200 may include the light-emitting device or the light-emitting device package according to an embodiment.

The light source module 2200 may include a light source unit 2210, a connection plate 2230, and a connector 2250. The member 2300 may be disposed on a top of the heat dissipation member 2400 and may include a guide groove 2310 into which a plurality of light source units 2210 and the connector 2250 are inserted.

The holder 2500 may plug an accommodation groove 2719 of an insulation unit 2710 of the internal case 2700. Therefore, the power supply unit 2600 accommodated into the insulation unit 2710 of the internal case 2700 may be sealed. The holder 2500 may include a guide protrusion 2510.

The power supply unit 2600 may include a protrusion 2610, a guide part 2630, a base 2650, and an extension part 2670. The internal case 2700 may include a molding part along with the power supply unit 2600. The molding part may be a part which is formed by solidifying a molding liquid, and the power supply unit 2600 may be fixed to the inside of the internal case 2700.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to illustrative embodiments thereof, it should be understood that numerous other modifications and embodiments can be devised by those skilled in the art that will fall within the spirit and scope of the principles of this disclosure. For example, each element described in detail in embodiments may be modified and implemented. Also, it should be construed that differences associated with the modifications and applications are included in the scope of embodiments defined in the appended claims.

INDUSTRIAL APPLICABILITY

A light-emitting device according to an embodiment may be applied to lighting units, display devices, backlight units, indication devices, lamps, street lamps, lighting devices for vehicles, display devices for vehicles, smart watches, etc., but is not limited thereto.

The invention claimed is:

1. A light-emitting device package comprising:
a package body;
a light-emitting device disposed on the package body;
a molding member disposed on the light-emitting device; and
a phosphor disposed in the molding member,
wherein an energy ratio of a wavelength spectrum of the light-emitting device package in a first wavelength range of 415 nm to 455 nm is 75% or less of energy of a wavelength spectrum of a sunlight source in the first wavelength range,
an energy ratio of a wavelength spectrum of the light-emitting device package in a second wavelength range of 465 nm to 495 nm is 60% or more of energy of a wavelength spectrum of a sunlight source in the second wavelength range.

2. The light-emitting device package of claim 1, wherein the phosphor comprises a first phosphor having a center wavelength of 515 nm to 570 nm and a second phosphor having a center wavelength of 580 nm to 670 nm, thereby implementing a white light source with an emission wavelength of the light-emitting device as an excitation wavelength,
wherein the energy ratio of the wavelength spectrum of the light-emitting device package in the second wavelength range of 465 nm to 495 nm is 100% or more of energy of the wavelength spectrum of the sunlight source in the second wavelength range.

3. The light-emitting device package of claim 1, wherein the energy ratio of the wavelength spectrum of the light-emitting device package compared with the energy of the wavelength spectrum of the sunlight source in the second wavelength range of 465 nm to 495 nm is higher than the energy ratio of the wavelength spectrum of the light-emitting device package compared with the energy of the wavelength spectrum of the sunlight source in the first wavelength range of 415 nm to 455 nm.

4. The light-emitting device package of claim 1, wherein, the phosphor comprises a first phosphor having a center wavelength of 515 nm to 570 nm and a second phosphor having a center wavelength of 580 nm to 670 nm, thereby implementing a white light source with an emission wavelength of the light-emitting device as an excitation wavelength,
wherein the energy ratio of the wavelength spectrum of the light-emitting device package compared with the energy of the wavelength spectrum of the sunlight source in the second wavelength range of 465 nm to 495 nm is higher than the energy ratio of the wavelength spectrum of the light-emitting device package compared with the energy of the wavelength spectrum of the sunlight source in the first wavelength range of 415 nm to 455 nm.

5. A lighting device comprises the light-emitting device package of claim 1.

6. A light-emitting device package comprising:
a package body;
a light-emitting device disposed on the package body;
a molding member disposed on the light-emitting device; and
a phosphor disposed in the molding member,
wherein
an energy ratio of a wavelength spectrum of the light-emitting device package compared with an energy of a wavelength spectrum of a sunlight source in a second wavelength range of 465 nm to 495 nm is higher than an energy ratio of a wavelength spectrum of the light-emitting device package compared with an energy of a wavelength spectrum of a sunlight source in a first wavelength range of 415 nm to 455 nm, wherein the energy ratio of the wavelength spectrum of the light-emitting device package in the second wavelength range of 465 nm to 495 nm is 60% or more of the energy of the wavelength spectrum of the sunlight source in the second wavelength range, and
the phosphor comprises a first phosphor which is a green phosphor and a second phosphor which is a red phosphor, thereby implementing a white light source with an emission wavelength of the light-emitting device as an excitation wavelength.

7. The light-emitting device package of claim 6, wherein the energy ratio of the wavelength spectrum of the light-emitting device package compared with the energy of the wavelength spectrum of the sunlight source in the first wavelength range of 415 nm to 455 nm is 75% or less of the energy of the wavelength spectrum of the sunlight source in the first wavelength range.

8. The light-emitting device package of claim 6, wherein the energy ratio of the wavelength spectrum of the light-emitting device package compared with the energy of the wavelength spectrum of the sunlight source in the second wavelength range of 465 nm to 495 nm is 100% or more of the energy of the wavelength spectrum of the sunlight source in the second wavelength range.

9. A light-emitting device package comprising:
   a package body;
   a light-emitting device disposed on the package body;
   a molding member disposed on the light-emitting device; and
   a phosphor disposed in the molding member,
   wherein
   an energy ratio of a wavelength spectrum of the light-emitting device package compared with an energy of a wavelength spectrum of a sunlight source in a second wavelength range of 465 nm to 495 nm is higher than an energy ratio of a wavelength spectrum of the light-emitting device package compared with an energy of a wavelength spectrum of a sunlight source in a first wavelength range of 415 nm to 455 nm,
   wherein the phosphor comprises a first phosphor having a center wavelength of 515 nm to 570 nm, a second phosphor having a center wavelength of 580 nm to 670 nm, and implementing a white light source with an emission wavelength of the light-emitting device as an excitation wavelength,
   wherein the energy ratio of the wavelength spectrum of the light-emitting device package in the second wavelength range of 465 nm to 495 nm is 60% or more of the energy of the wavelength spectrum of the sunlight source in the second wavelength range.

10. The light-emitting device package of claim 9, further comprising a third phosphor having a center wavelength of 490 nm to 505 nm.

11. The light-emitting device package of claim 10, wherein the third phosphor having the center wavelength of 490 nm to 505 nm is a cyan phosphor, and a composition of the third phosphor is one or more of $(Ba, Mg)_{3-a}Si_{6-b}O_{3.5-c}N_{8.5-d}(Li, Cl, F, P)_{1-e}:Eu^{2+}_a$, $(Ba, Mg, Ca, Sr)_{3-a}Si_6O_3N_8:Eu^{2+}_a$, $(Ba, Mg, Ca, Sr)_{1-a}Si_2O_2N_2:Eu^{2+}_a$.

12. The light-emitting device package of claim 10, wherein the first phosphor is a green phosphor and the second phosphor is a red phosphor, and the third phosphor is a cyan phosphor,
   wherein a phosphor composition of the first phosphor is higher in ratio than the second phosphor, and
   wherein a phosphor composition of the third phosphor is less in ratio than the second phosphor.

13. The light-emitting device package of claim 9, wherein the energy ratio of the wavelength spectrum of the light-emitting device package compared with the energy of the wavelength spectrum of the sunlight source in the first wavelength range of 415 nm to 455 nm is 75% or less of the energy of the wavelength spectrum of the sunlight source having the first wavelength range.

14. The light-emitting device package of claim 13, wherein the energy ratio of the wavelength spectrum of the light-emitting device package in the first wavelength range of 415 nm to 455 nm is 60% or less of the energy of the wavelength spectrum of the sunlight source in the first wavelength range.

15. The light-emitting device package of claim 9, wherein the energy ratio of the wavelength spectrum of the light-emitting device package in the second wavelength range of 465 nm to 495 nm is 80% or more of the energy of the wavelength spectrum of the sunlight source in the second wavelength range.

16. The light-emitting device package of claim 9, wherein the energy ratio of the wavelength spectrum of the light-emitting device package in the second wavelength range of 465 nm to 495 nm is 100% or more of the energy of the wavelength spectrum of the sunlight source in the second wavelength range.

17. The light-emitting device package of claim 9, wherein the first phosphor is a green phosphor and the second phosphor is a red phosphor, and
   a phosphor composition of the first phosphor is higher in ratio than the second phosphor.

18. The light-emitting device package of claim 17, wherein a relative ratio of the first phosphor and the second phosphor is 85 wt % to 95 wt % or 5 wt % to 15 wt %.

* * * * *